(12) United States Patent
Chino

(10) Patent No.: US 6,674,779 B2
(45) Date of Patent: Jan. 6, 2004

(54) SEMICONDUCTOR LASER DEVICE AND METHOD FOR PRODUCING THE SAME

(75) Inventor: Toyoji Chino, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 209 days.

(21) Appl. No.: 09/805,068

(22) Filed: Mar. 13, 2001

(65) Prior Publication Data

US 2002/0001326 A1 Jan. 3, 2002

(30) Foreign Application Priority Data

Mar. 14, 2000 (JP) ........................................ 2000-071344

(51) Int. Cl.$^7$ ................................................ H01S 5/00
(52) U.S. Cl. ................................................ 372/50; 372/46
(58) Field of Search ........................ 372/46, 50; 257/99

(56) References Cited

U.S. PATENT DOCUMENTS 4,799,227 A * 1/1989 Kaneiwa et al. ............... 372/46
5,504,768 A   4/1996 Park et al. ..................... 372/46
5,715,267 A * 2/1998 Iwase ............................. 372/46
5,880,487 A * 3/1999 Furukawa et al. ............. 257/99
6,034,982 A * 3/2000 Iwase ............................. 372/50

* cited by examiner

Primary Examiner—Quyen Leung
(74) Attorney, Agent, or Firm—RatnerPrestia

(57) ABSTRACT

A semiconductor laser device includes a substrate, a light emission region provided on the substrate, and an alignment stripe provided on the substrate so as to be adjacent to the light emission region. The light emission region includes a first active layer stripe having a layered structure including a first waveguide layer, an active layer, and a second waveguide layer, a first buried layer formed so as to cover side faces of the active layer stripe, a second buried layer formed on the first buried layer, and a third buried layer formed on the second buried layer and the active layer stripe. The alignment stripe includes a second active layer stripe having a layered structure including the first waveguide layer, the active layer, and the second waveguide layer, and a selective growth mask formed on the second active layer stripe and formed of a material on which the first buried layer, the second buried layer and the third buried layer are incapable of growing.

5 Claims, 6 Drawing Sheets

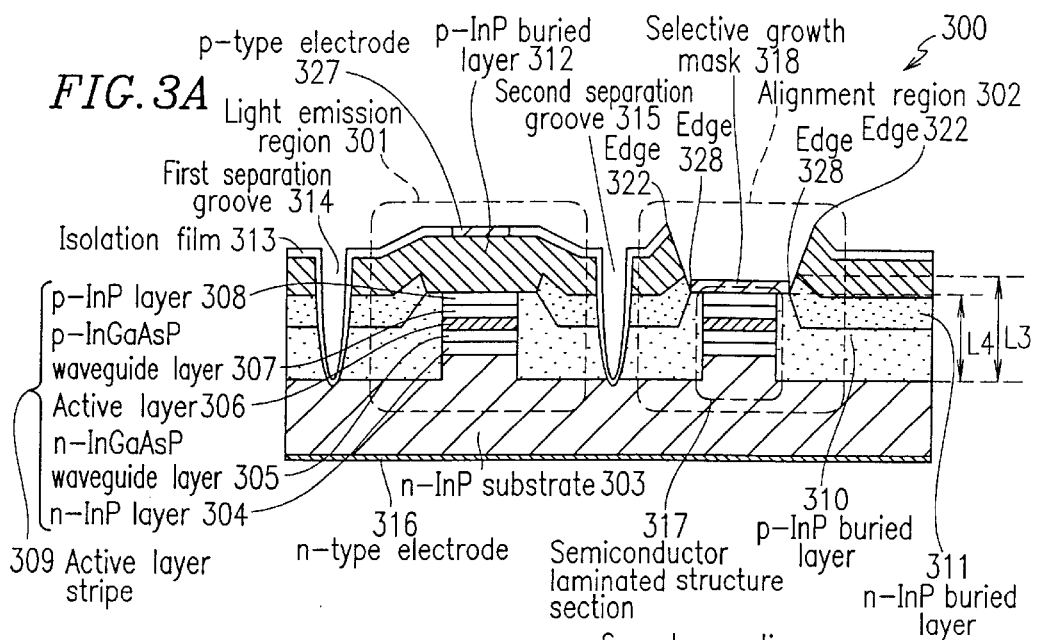
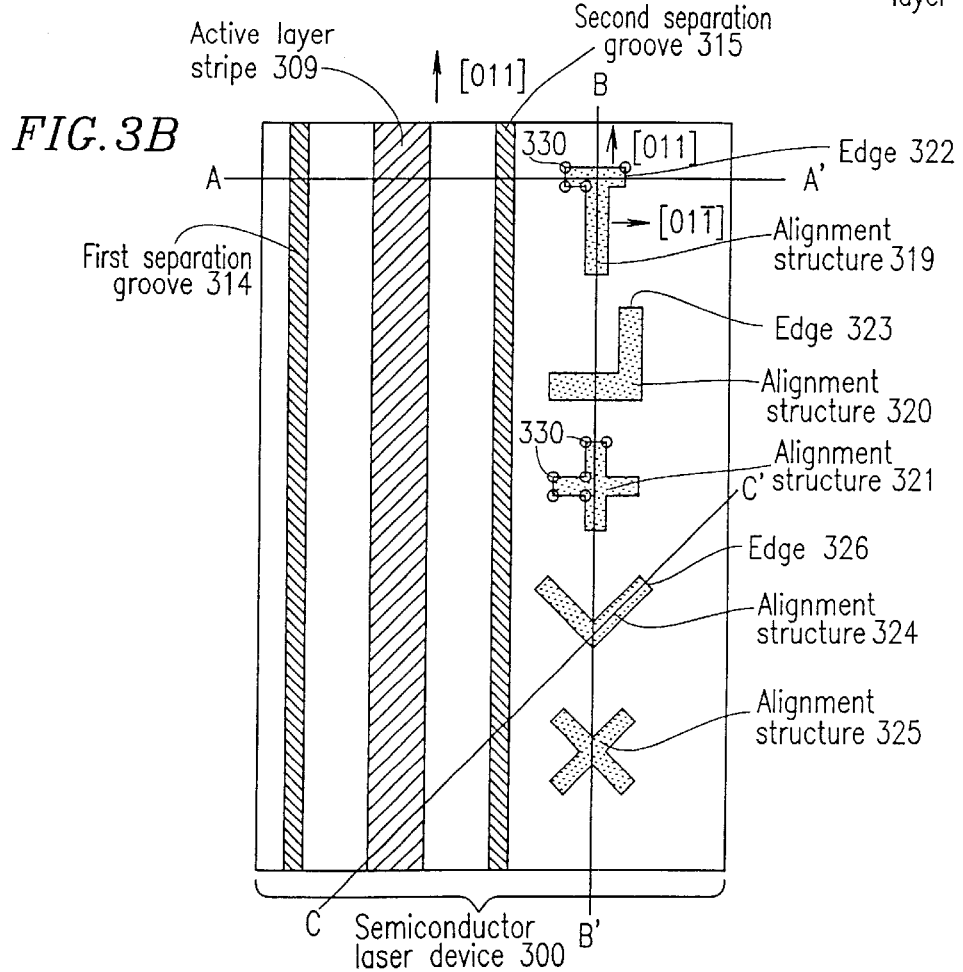

SEMICONDUCTOR LASER DEVICE AND METHOD FOR PRODUCING THE SAME

BACKGROUND OF THE INVENTION

1. Field of the Invention

The present invention relates to a buried heterostructure type semiconductor laser device and a method for producing the same.

2. Description of the Related Art

A conventional buried heterostructure type semiconductor laser device (hereinafter, referred to as "BHLD") includes a light emission region, which is formed by an active layer stripe, and a buried layer for burying the active layer stripe, and separation grooves. A separation groove is provided on each side of the light emission region for electrical isolation in order to prevent capacitance of peripheral elements from affecting the light emission region. Outside the separation grooves, no active layer stripe is provided, and only the buried layer is formed on a substrate.

A method for producing the conventional BHLD will be briefly described below. First, semiconductor layers for forming an active layer stripe are crystal-grown on the substrate, and a dielectric film is formed thereon in a stripe shape. Then, the semiconductor layers are etched using the dielectric film as a mask to form the active layer stripe. Thereafter, the dielectric film is removed, and the active layer stripe is buried by using a liquid growth method. In this process, the buried layer causes difficulty in locating the active layer stripe with accuracy. Therefore, in order to perform subsequent production steps, a portion of the buried layer on the substrate is removed by etching to expose the active layer stripe. After the active layer stripe has been located, an alignment key is formed on the active layer stripe for use in the steps of forming a p-type electrode, forming separation grooves, gold-plating, forming scribe lanes, mounting, etc.

In this conventional method for producing the BHLD, for example, the alignment key used in each of the above-described steps may cause at least two deviations, i.e.: an alignment key position formed on the exposed active layer stripe may deviate from a predetermined position; and a pattern position which is formed in each step using the alignment key as a reference line may deviate from a predetermined position.

In the case of flip chip-mounting of a semiconductor laser device, a light emission point of the semiconductor laser device is aligned with an optical axis of an optical fiber combined with a chip carrier by combining an alignment key for mounting, which has been formed on a surface of the semiconductor laser device, with an alignment key formed on the chip carrier. However, as described above, since the alignment key for mounting formed on the surface of the semiconductor laser device may cause at least two deviations, in principle, alignment of the optical fiber with the light emission point after the flip chip-mounting is affected by such deviations. Furthermore, when a plurality of active layer stripes are provided, a deviation θ is caused between an alignment key 602 and an active layer stripe 601 as illustrated in FIG. 7, and accordingly, alignment accuracy is further degraded.

In recent years, development has been eagerly carried out for the purpose of reducing production costs of a module including a semiconductor laser device mounted thereon. In order to realize such a module, simplified production/assembly steps achieving high light-coupling efficiency are required. Conventionally, to this end, the semiconductor laser device is flip chip-mounted on a module by passive alignment in which the semiconductor laser device is aligned with an optical fiber of the module using only their alignment keys.

However, in such a conventional method, the positional accuracy of the alignment key used for mounting with respect to the light emission point is poor. Therefore, even if the alignment key alignment for mounting with an alignment key on the chip carrier is perfectly performed, the light emission point is not necessarily accurately placed on the optical axis of the optical fiber. That is, the optical axis of the optical fiber is misaligned with that of the semiconductor laser device. Thus, it is difficult to achieve high light-coupling efficiency. Moreover, when removing a portion of the buried layer on the active layer stripe by etching, organic contamination may occur on a surface of the active layer stripe. Such contamination reduces production yield.

SUMMARY OF THE INVENTION

According to one aspect of the invention, there is provided a semiconductor laser device including a substrate, a light emission region provided on the substrate, and an alignment stripe provided on the substrate so as to be adjacent to the light emission region. The light emission region includes a first active layer stripe having a layered structure including a first waveguide layer, an active layer, and a second waveguide layer, a first buried layer formed so as to cover side faces of the active layer stripe, a second buried layer formed on the first buried layer, and a third buried layer formed on the second buried layer and the active layer stripe. The alignment stripe includes a second active layer stripe having a layered structure including the first waveguide layer, the active layer, and the second waveguide layer, and a selective growth mask formed on the second active layer stripe and formed of a material on which the first buried layer, the second buried layer and the third buried layer are incapable of growing.

According to one embodiment of the invention, at least one of faces of the third buried layer has a (111) face, a neighborhood face of the (111) face, a (001) face, and a neighborhood face of the (001) face which is present in the vicinity of both sides of selective growth mask in the alignment stripe.

According to another aspect of the invention, there is provided a semiconductor laser device including a substrate, a light emission region provided on the substrate, and an alignment region provided on the substrate so as to be adjacent to the light emission region. The light emission region includes an active layer stripe having a layered structure including a first waveguide layer, an active layer, and a second waveguide layer, a first buried layer formed so as to cover side faces of the active layer stripe, a second buried layer formed on the first buried layer, and a third buried layer formed on the second buried layer and the active layer stripe. The alignment region includes an active layer region having a layered structure including the first waveguide layer, the active layer, and the second waveguide layer, and a selective growth mask formed on the active layer region and formed of a material on which the first buried layer, the second buried layer and the third buried layer are incapable of growing.

According to one embodiment of the invention, at least one of faces of the third buried layer has a (111) face, a neighborhood face of the (111) face, a (001) face, and a neighborhood face of the (001) face which is present in the vicinity of the edges of selective growth mask in the alignment region.

According to another embodiment of the invention, the active layer stripe is formed so as to extend in a [011] direction, and the selective growth mask has at least one of the sides which includes a side which extends in a direction substantially parallel to the active layer stripe, a side which extends in a direction substantially perpendicular to the active layer stripe, and a side which extends in a direction crossing the active layer stripe at an angle of approximately 45 degrees.

According to still another aspect of the invention, there is provided a method for producing a semiconductor laser device including the steps of: growing a first semiconductor film which includes a first waveguide layer, an active layer, and a second waveguide layer on a substrate; forming on the first semiconductor film a selective growth film of a material on which second and third semiconductor films are incapable of growing; processing the selective growth film into two or more stripes; etching the first semiconductor film using the stripes of the selective growth film as masks, thereby forming an active layer stripe; growing the second semiconductor film as a buried layer on side faces of the active layer stripe and on a surface from which the first semiconductor film has been removed while the selective growth film is left unremoved; removing the selective growth film stripes while at least one of the two or more stripes is left unremoved; growing the third semiconductor film after the selective growth film has been removed.

According to one embodiment of the invention, the method for producing a semiconductor laser device further includes the step of forming an alignment key using an edge formed by a face of the third semiconductor film grown in a [100] direction and at least one of faces of the third semiconductor film includes: a (111) face; a neighborhood face of the (111) face; a (001) face; and a neighborhood face of the (001) face which is present in the vicinity of a side of the unremoved selective growth film, or using edges of the unremoved selective growth film as reference lines.

According to still another aspect of the invention, there is provided a method for producing a semiconductor laser device including the steps of: growing a first semiconductor film which includes a first waveguide layer, an active layer, and a second waveguide layer on a substrate; forming on the first semiconductor film a selective growth film of a material on which second and third semiconductor films are incapable of growing; processing the selective growth film into one or more stripes and into a prescribed form which has at least one of the sides including a side extending in a direction substantially parallel to the stripe of the selective growth film, a side extending in a direction substantially perpendicular to the stripe, and a side crossing the stripe form at an angle of approximately 45 degrees; etching the first semiconductor film using the stripe of the selective growth film as a mask, thereby forming an active layer stripe, and etching the first semiconductor film using the selective growth film processed into the prescribed form as a mask, thereby forming an alignment region; growing the second semiconductor film as a buried layer on side faces of the active layer stripe, side surfaces of the alignment region, and a surface from which the first semiconductor film has been removed while the selective growth film is left unremoved; removing the selective growth film except for the selective growth film processed into the prescribed forms; and growing the third semiconductor film after the selective growth film has been removed.

According to one embodiment of the invention, the method for producing a semiconductor laser device further includes the step of forming an alignment key using an edge formed by a face of the third semiconductor film grown in a [100] direction and at least one of faces of the third semiconductor film includes: a (111) face; a neighborhood face of the (111) face; a (001) face; and a neighborhood face of the (001) face which is present in the vicinity of both sides of the unremoved selective growth film, or using edges of the unremoved selective growth film as reference lines.

According to the above-described structure, since the active layer stripe and the selective growth mask are produced during the process of forming the layered structure, the light emission point and the alignment stripe or the alignment region can be formed as designed so as to have a predetermined positional relationship therebetween. Therefore, when the alignment keys for use in subsequent steps are formed by using edges of the selective growth mask as reference lines, a deviation of the alignment keys from the predetermined position with respect to the light emission point is reduced by half in comparison with that of the conventional structure. Accordingly, the misalignment of the alignment key for mounting formed on the semiconductor laser device surface with respect to the alignment key on the chip carrier of the chip carrier is also reduced by half. Moreover, it is not required to remove the buried layer on the active layer stripe by etching, as performed in the conventional method, in order to locate the active layer stripe. Thus, organic contamination on the surface of the light emission region can be prevented, whereby the light emission efficiency can be improved. In addition, the deviation $\theta$ of the alignment key from a predetermined position with respect to the active layer stripe can be prevented.

Alternatively, in the case of flip chip-mounting a semiconductor laser device on a chip carrier, when the semiconductor laser device is aligned with the chip carrier using the edges of the alignment stripe or the alignment region as reference lines in place of the alignment keys for mounting, the mounting accuracy is significantly improved in comparison with that of the conventional structure.

The (111) or (001) faces are formed in an alignment stripe or an alignment region so that sharp edges are formed in a vertical cross section of the semiconductor laser device taken along a line which extends in any one of the following directions: a direction which is substantially parallel to a longitudinal direction of a resonator of the semiconductor laser device (stripe direction); a direction which is substantially perpendicular to the stripe direction; and a direction which crosses the stripe direction at an angle of 45 degrees. Therefore, such edges of the alignment stripe or the alignment region can be more readily identified. Thus, when the semiconductor laser device is mounted on the chip carrier using such edges as reference lines for alignment, alignment accuracy improves. According to the present invention, the (111) faces may be either a (111)A or (111)B face. When the buried layers are ideally grown, a (001) face may be formed besides a (111)A or (111)B face. Each of these faces may deviate by ±20 degrees from a prescribed angle according to a shape of a cross section of the stripe, or the width of the selective growth mask. Such a face is hereinafter referred to as a "neighborhood face".

Thus, the invention described herein makes possible the advantages of providing: (1) a semiconductor laser device in which a location of an active layer stripe can be accurately identified to prevent the deviation of alignment keys from predetermined positions with respect to a light emission point, the production yield can be improved without causing surface organic contamination of a light emission region and the semiconductor laser device can be aligned with an optical fiber with high accuracy, whereby production cost of the semiconductor laser module can be reduced; and (2) a method for producing such a semiconductor laser device.

These and other advantages of the present invention will become apparent to those skilled in the art upon reading and understanding the following detailed description with reference to the accompanying figures.

BRIEF DESCRIPTION OF THE DRAWINGS

FIG. 3A is a cross-sectional view illustrating a structure of a semiconductor laser device 300 according to Example 2 of the present invention.

FIG. 3B is a plan view of the semiconductor laser device 300 according to Example 2 of the present invention.

DESCRIPTION OF THE PREFERRED EMBODIMENTS

Hereinafter, embodiments of the present invention will be described with reference to the drawings.

(EXAMPLE 1)

Figure 1:
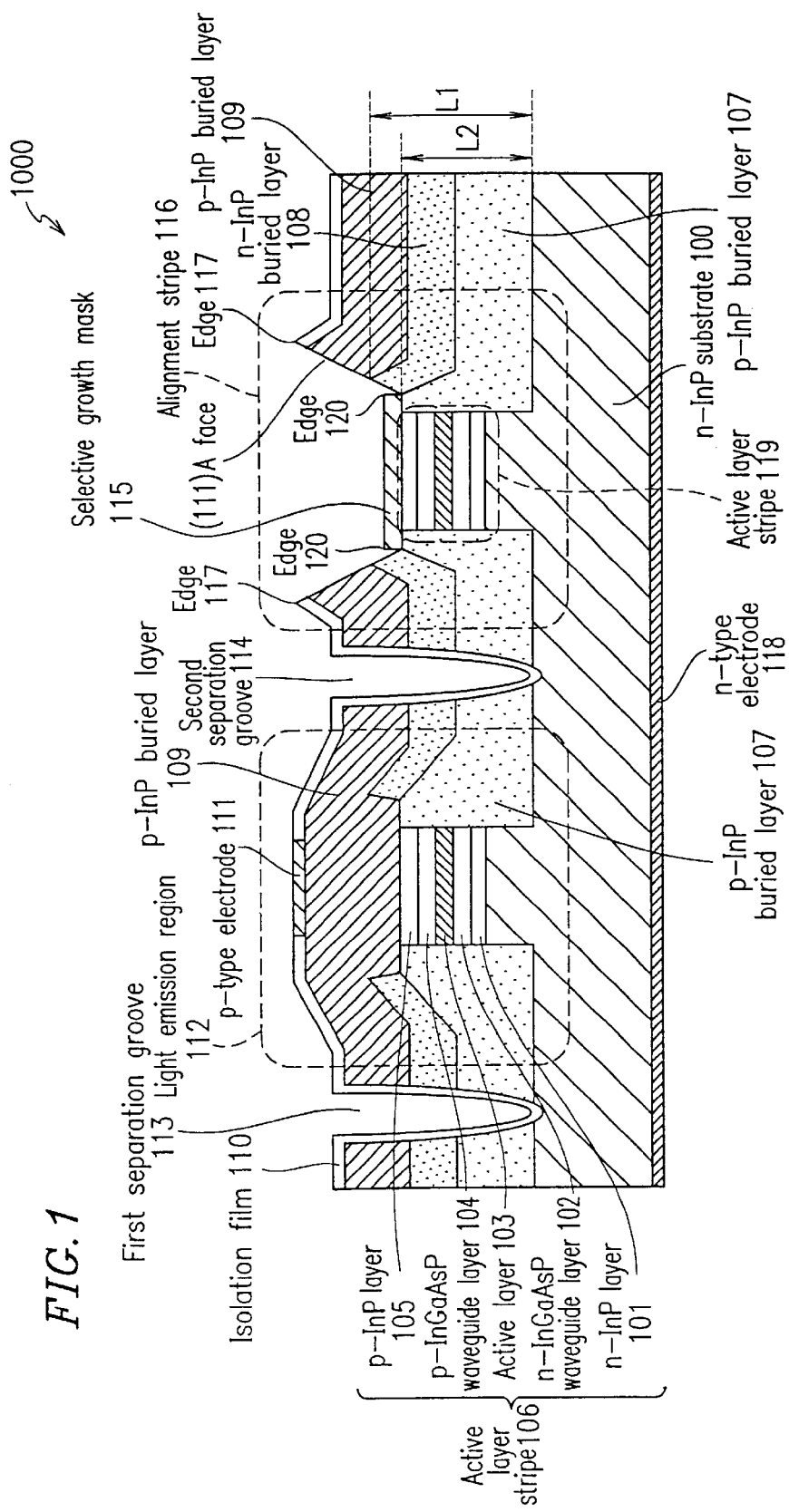
FIG. 1 is a cross-sectional view illustrating a structure of a semiconductor laser device 1000 according to Example 1 of the present invention.

FIG. 1 is a cross-sectional view of a semiconductor laser device 1000 according to Example 1 of the present invention. The semiconductor laser device 1000 includes a light emission region 112 and an alignment stripe 116. In the light emission region 112, an active layer stripe 106, a p-InP buried layer 107, an n-InP buried layer 108, and a p-InP buried layer 109 are formed on an n-InP substrate 100. The active layer stripe 106 is formed of an n-InP layer 101, an n-InGaAsP waveguide layer 102, an active layer 103, a p-InGaAsP waveguide layer 104, and a p-InP layer 105 which are deposited on the n-InP substrate 100 in this order and processed into a stripe form. The active layer stripe 106 extends in a direction perpendicular to a sheet of FIG. 1 ([011] direction), and each of the end faces thereof are a cleavage facet of crystal (not shown). Side faces of the active layer stripe 106 are covered with the p-InP buried layer 107. An n-InP buried layer 108 is provided on the p-InP buried layer 107. The p-InP buried layer 109 is crystal-grown on the active layer stripe 106, the p-InP buried layer 107, and the n-InP buried layer 108 as shown in FIG. 1. There may be a case where the n-InP buried layer 108 is grown to cover the p-InP buried layer 107. An isolation film 110 and a p-type electrode 111 are formed on the p-InP buried layer 109. On a back surface of the n-InP substrate 100, an n-type electrode 118 is formed. On the both sides of the light emission region 112, a first separation groove 113 and a second separation groove 114 are formed for providing electrical isolation from adjacent semiconductor laser devices.

The alignment stripe 116 is formed adjacent to the second separation groove 114 in parallel with the active layer stripe 106. The alignment stripe 116 includes an active layer stripe 119 having a structure identical to that of the active layer stripe 106, with the additional feature of a selective growth mask 115 formed on the active layer stripe 119 in a stripe formation, the p-InP buried layer 107, the n-InP buried layer 108, and the p-InP buried layer 109. Although FIG. 1 illustrates a case where the side faces of the active layer stripe 119 are covered only by the layer 107, the n-InP buried layer 108 and the p-InP buried layer 109 may cover the side faces of the active layer stripe 119. The alignment stripe 116 is formed in parallel with the active layer stripe 106 which extends in the [011] direction.

The selective growth mask 115 is formed of such a material that the p-InP buried layer 109 does not grow thereon. The p-InP buried layer 109 is grown so as to have side faces as (111)A face which is present in the vicinity of both sides of the selective growth mask 115. A sharp edge 117 is formed by the (111)A face and a (100) face which is a growth face.

The edges 117 can be observed as clear lines with infrared rays. Therefore, the respective edges 117 can be used as a reference line to form alignment keys for the p-type electrode 111, the first separation groove 113, and the second separation groove 114, and an alignment key for mounting as indicated by a reference numeral "401" of FIG. 5, so that a group of the alignment keys can be accurately formed in predetermined positions with respect to the active layer stripe 106 (light emission point). As a result, various patterns can be formed at various steps so as to accurately achieve a predetermined position relationship with the light emission point.

In the case of flip chip-mounting a semiconductor laser device having the alignment stripe 116 on a chip carrier, the edges 117 are aligned with alignment keys formed on a surface of the chip carrier. Since the edges 117 have been formed accurately in a predetermined position with respect to the light emission point, the semiconductor laser device can be mounted on the chip carrier with minimum misalignment. Even when an optical fiber has already been combined with the chip carrier, the semiconductor laser device is mounted on the chip carrier while aligning the laser device with the optical fiber using the alignment keys (passive alignment) without monitoring the optical power from the optical fiber (active alignment), so that light from the laser device can be coupled to the optical fiber with a high light-coupling efficiency.

In Example 1, the edges 117 are used as reference lines for alignment. However, similar effects can be attained by using edges 120 on the periphery of the selective growth mask 115 for alignment instead of the edges 117. In such a case, it is desirable to observe the edges 120 with a commonly-employed microscope since the edges 120 are blurred when observed with infrared rays.

Next, production steps of the semiconductor laser device according to Example 1 will be described with reference to FIG. 2.

Figure 2A:
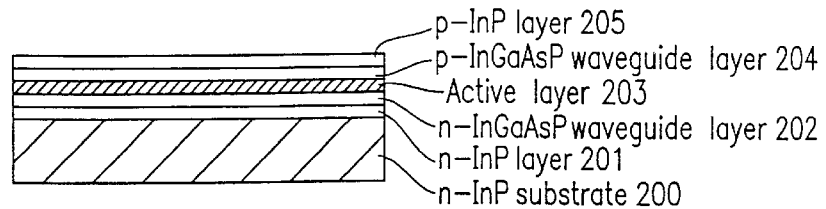
FIGS. 2A through 2E are cross-sectional views each illustrating a production step of a semiconductor device according to Example 1 of the present invention.

At a first step, an n-InP layer 201, an n-InGaAsP waveguide layer 202, an active layer 203, a p-InGaAsP waveguide layer 204 and a p-InP layer 205 are grown on an n-InP substrate 200 in this order by a vapor growth method (FIG. 2A).

Figure 2B:
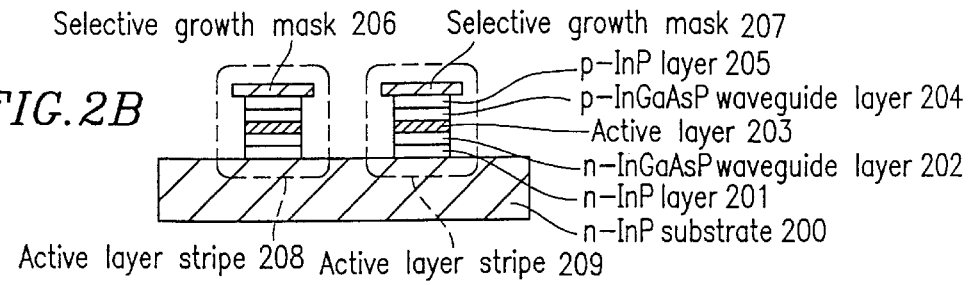

Next, over the top of the grown layers, selective growth masks 206 and 207 of a dielectric film are deposited and processed into a prescribed form (not shown). The selective growth masks 206 and 207 are formed of such a material that a semiconductor layer does not epitaxially grow thereon, e.g., a dielectric film of amorphous $SiO_2$, amorphous $SiN_x$ or the like. Then, the resultant structure is etched by wet etching using the selective growth masks 206 and 207 as masks until a portion of the n-InP substrate 200 is etched so as to form active layer stripes 208 and 209 as shown in FIG. 2B.

Figure 2C:
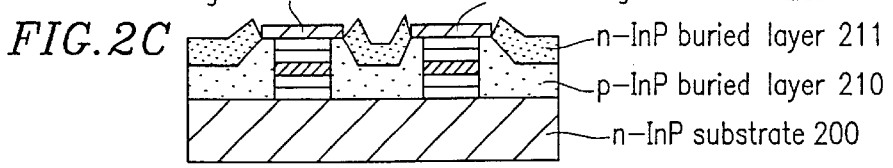

Subsequently, with the selective growth masks 206 and 207 left unremoved, a p-InP buried layer 210 and a n-InP buried layer 211 are grown in this order by a liquid growth or vapor growth method. At this time, the p-InP buried layer 210 and the n-InP buried layer 211 are not grown on the selective growth masks 206 and 207 of a dielectric film (FIG. 2C).

Figure 2D:
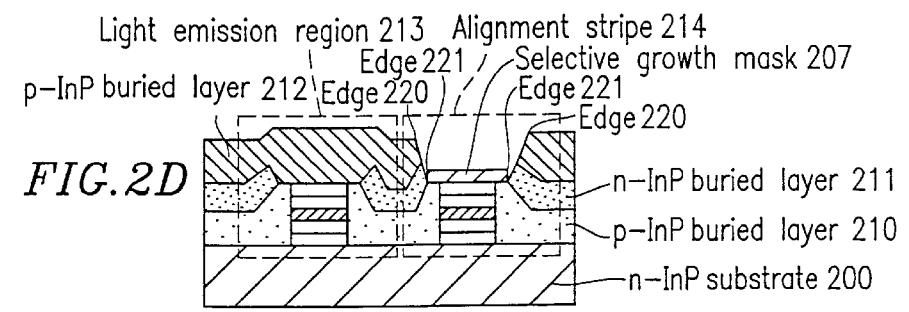

Next, a resist is formed only on the selective growth mask 207, and the selective growth mask 206 is removed (not shown). Thereafter, the resist is removed, and a p-InP buried layer 212 is grown, again, by a liquid growth or vapor growth method. At this time, the p-InP buried layer 212 does not grow on the selective growth mask 207, so that the p-InP buried layer 212 has side faces as (111)A faces which are present in the vicinity of both sides of the selective growth mask 207 (FIG. 2D). The active layer stripe 208, the p-InP buried layer 210, the n-InP buried layer 211 and the p-InP buried layer 212 form the light emission region 213. The active layer stripe 209, the selective growth mask 207, the p-InP buried layer 210, the n-InP buried layer 211, and the p-InP buried layer 212 form an alignment stripe 214. The alignment stripe 214 has edges 220, and the selective growth mask 207 has edges 221 on the periphery thereof.

Figure 2E:
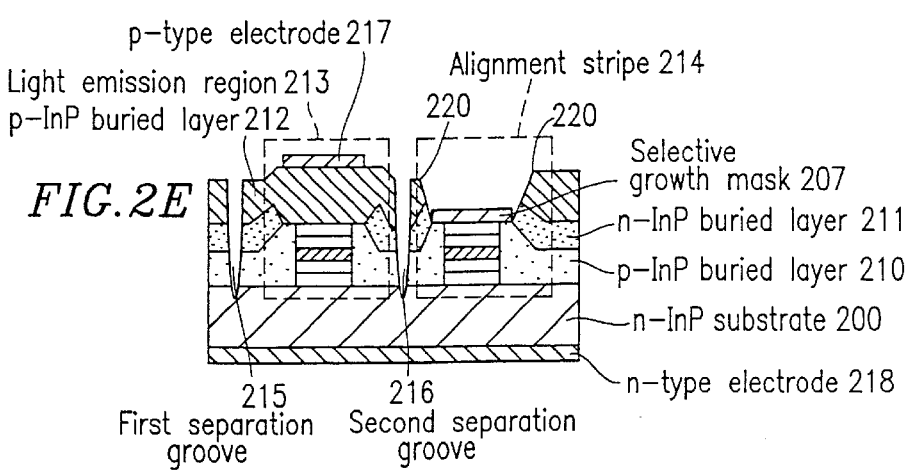

Thereafter, a first separation groove 215, a second separation groove 216, and a p-type electrode 217 on the p-InP buried layer 212 of the light emission region 213 are formed using the edges 220 of the alignment stripe 214 or the edges 221 of the selective growth mask 207 as alignment keys, or using alignment keys formed using these edges as reference lines for alignment. An n-type electrode 218 is formed on a back surface of the n-InP substrate 200. In this way, a semiconductor laser device having the light emission region 213 and the alignment stripe 214 is completed as shown in FIG. 2E. The edges 220 of the alignment stripe 214, the edges of the selective growth mask 207, or the alignment keys formed using these edges as reference lines for alignment, which are used in the process of forming the semiconductor laser device, can be used as the alignment keys for mounting the semiconductor laser device on the chip carrier as described above.

(EXAMPLE 2)

FIG. 3 illustrates a structure of a semiconductor laser device 300 according to Example 2 of the present invention. FIG. 3A illustrates a cross section of the semiconductor laser device 300 taken along line A–A' of FIG. 3B. FIG. 3B is a plan view of the semiconductor laser device 300 according to Example 2.

In the semiconductor laser device 300, an n-InP layer 304, an n-InGaAsP waveguide layer 305, an active layer 306, a p-InGaAsP waveguide layer 307, and a p-InP layer 308 are deposited on an n-InP substrate 303 in this order and processed into a stripe form so as to form an active layer stripe 309. The active layer stripe 309 extends in a direction perpendicular to the sheet of FIG. 3A ([011] direction), and each of the end faces thereof is a cleavage facet of crystal (not shown). Side faces of the active layer stripe 309 are covered with a p-InP buried layer 310. An n-InP buried layer 311 is provided on the p-InP buried layer 310. A p-InP buried layer 312 is crystal-grown on the active layer stripe 309, the p-InP buried layer 310 and the n-InP buried layer 311 as shown in FIG. 3A. There may be a case where the n-InP buried layer 311 is grown to cover the p-InP buried layer 310. An isolation film 313 and a p-type electrode 327 are formed on the p-InP buried layer 312. The active layer stripe 309, the p-InP buried layer 310, the n-InP buried layer 311, and the p-InP buried layer 312 form a light emission region 301. On either side of the light emission region 301, a first separation groove 314 and a second separation groove 315 are formed for providing electrical isolation from adjacent semiconductor laser devices. On a back surface of the n-InP substrate 303, an n-type electrode 316 is deposited.

An alignment region 302 is formed adjacent to the second separation groove 315 in parallel with the active layer stripe 309. The alignment region 302 includes a semiconductor laminated structure section 317, a selective growth mask 318, the p-InP buried layer 310 and the n-InP buried layer 311. The semiconductor laminated structure section 317 has a layered structure identical to that of the active layer stripe 309. The selective growth mask 318 is formed on the semiconductor laminated structure section 317 in a prescribed form. Although FIG. 3A illustrates a case where the side faces of the semiconductor laminated structure section 317 is covered only by the p-InP buried layer 310, the n-InP buried layer 311 may cover the side faces of the semiconductor laminated structure section 317.

Figure 4A:
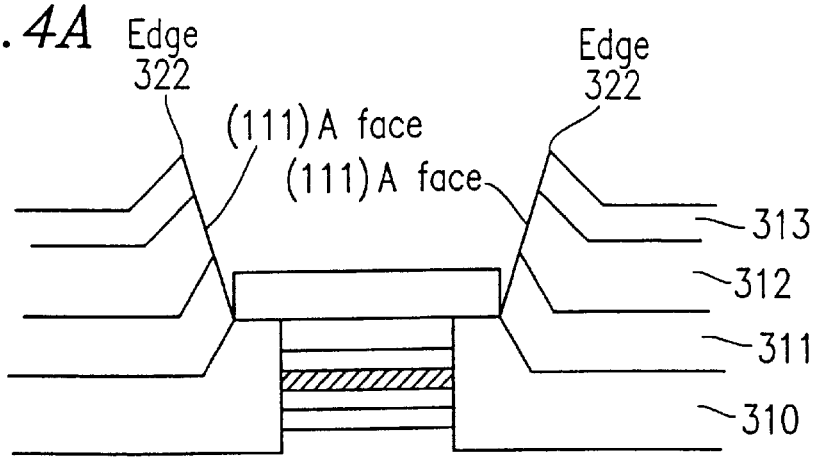
FIGS. 4A through 4C are cross-sectional views each explaining a crystal growth face of an alignment structure of the semiconductor laser device 300 according to Example 2 of the present invention.
Figure 4B:
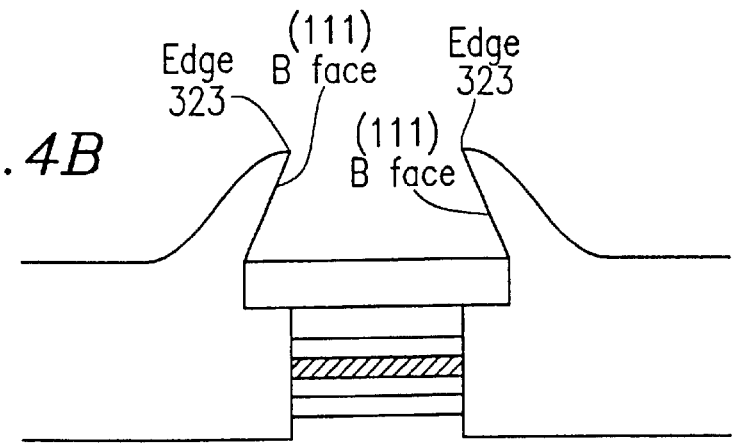
Figure 4C:
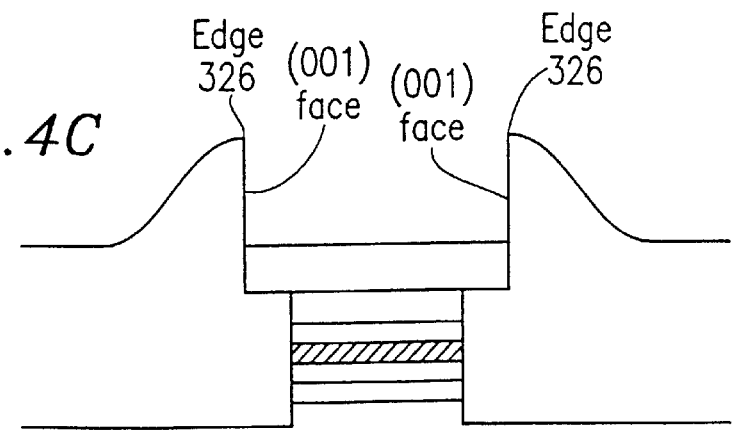

In Example 2, the selective growth mask 318 may have a variety of shapes, e.g., an "L", "T", "+", "V" or "X" shape. In Example 2, unlike the active layer stripe 309, the semiconductor laminated structure section 317 has a layered structure identical to that of the active layer stripe 309, but does not form a line (stripe) shape extending in a direction perpendicular to the sheet of FIG. 3A ([011] direction). The semiconductor laminated structure section 317 is separated into a plurality of alignment structures placed along the [011] direction, as shown in FIG. 3B. Alignment structures 319, 320, and 321 have sides extending in a direction which is substantially parallel to or substantially perpendicular to the active layer stripe 309. In a cross section of the semiconductor laser device 300 taken along line A–A' of FIG. 3B, side faces of the n-InP buried layer 311, the p-InP buried layer 312 and a layer 313 are (111)A faces as shown in FIG. 4A since the p-InP buried layers 310, the n-InP buried layer 311, and the p-InP buried layer 312 have not grown on the selective growth mask 318. In a cross section of the semiconductor laser device 300 taken along line B–B' of FIG. 3B, (111)B faces are formed as shown in FIG. 4B. Furthermore, edges 322 are formed by the (111)A face and a (100) face which is a growth face. Edges 323 are formed by the (111)B face and the (100) face. Alignment structures 324 and 325 have sides extending in a direction crossing a direction in which the active layer stripe 309 extends ([011] direction) at an angle of approximately 45 degrees. In a cross section of the semiconductor laser device 300 taken along line C–C' of FIG. 3B, (001) faces are formed as shown in FIG. 4C. Edges 326 are formed by the (001) face and the a (100) face As shown in FIGS. 3A and 3B, the semiconductor laser device 300 includes a light emission region 301 and an alignment region 302. The alignment region 302 includes the alignment structures 319, 320, 321, 324, and 325. The alignment structures 319, 320, and 321 include the edges 322 of the (111)A faces and the edges 323 of the (111)B faces. The edges 322 and 323 can be observed as clear lines with infrared rays. The respective edges 322 and 323 can be used as reference lines to form alignment keys for various production steps, so that a group of the alignment keys can be formed with a high alignment accuracy with respect to the active layer stripe 309 (light emission point). As a result, various patterns can be formed at various production steps with decreased misalignment with respect to the light emission point.

In the case of edges 322 and 323, the (111)A face growing at an oblique angle as shown in FIG. 4A meets the (111)B face growing to form an overhang as shown in FIG. 4B at each corner 330 (as denoted by ○) of FIG. 3B. Therefore, the position of corners of the alignment structures having various shapes such as "T", "L", "+", etc., might not be identified accurately. In the case of edges 326, the (111)A face and the (111)B face interfere with each other while growing, and such interference results in the formation of the (001) face. In this case, the corners of alignment structures can be identified accurately. Therefore, with the edges 326 used as reference lines, more accurate alignment can be achieved.

Figure 5A:
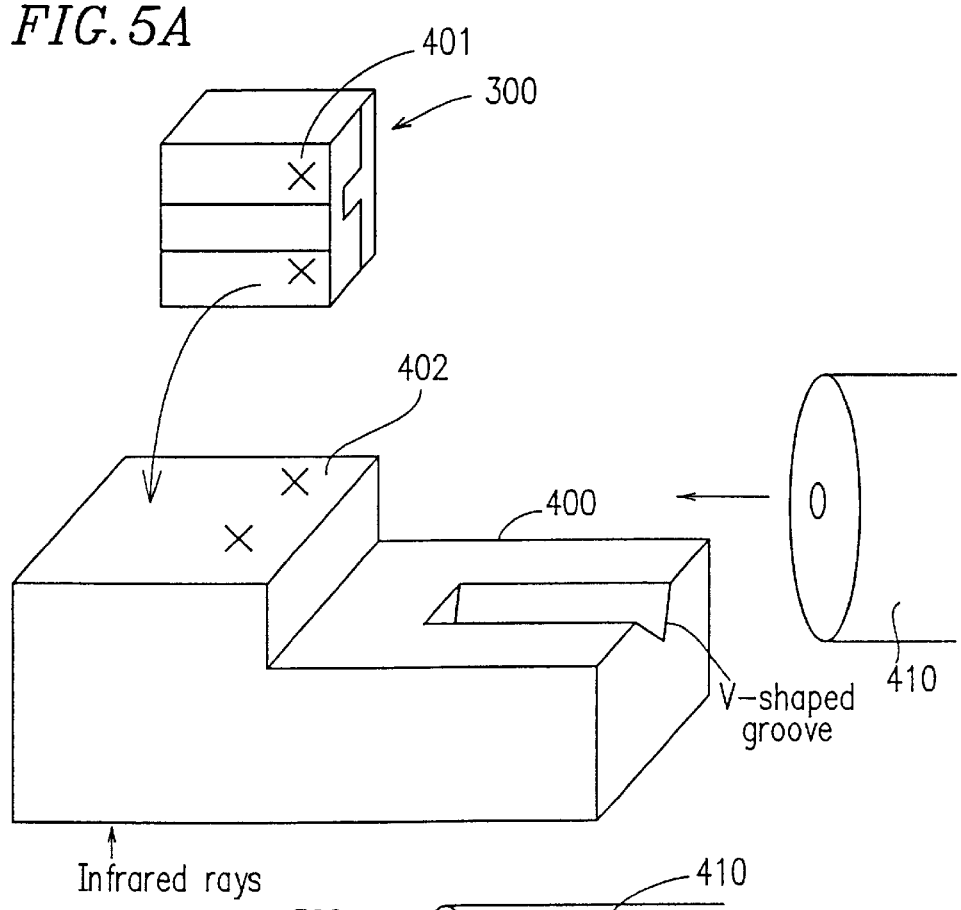
FIGS. 5A and 5B are perspective views each explaining a method for mounting the semiconductor laser device 300 according to Example 2 of the present invention.
Figure 5B:
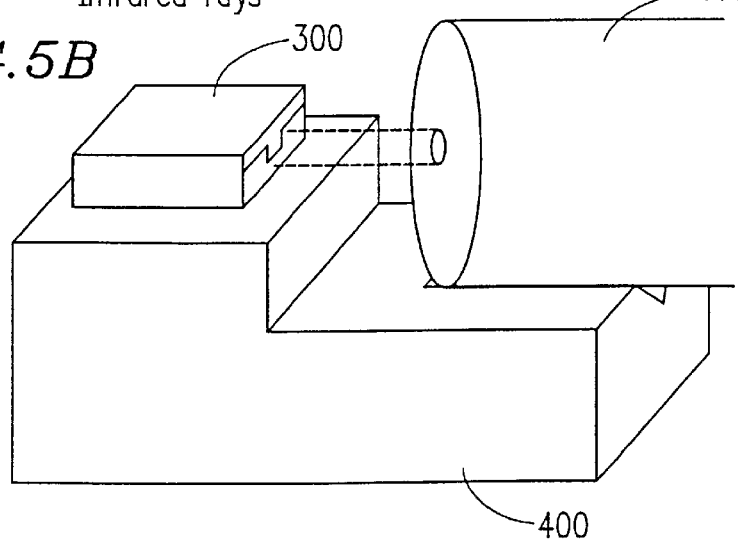
Figure 7:
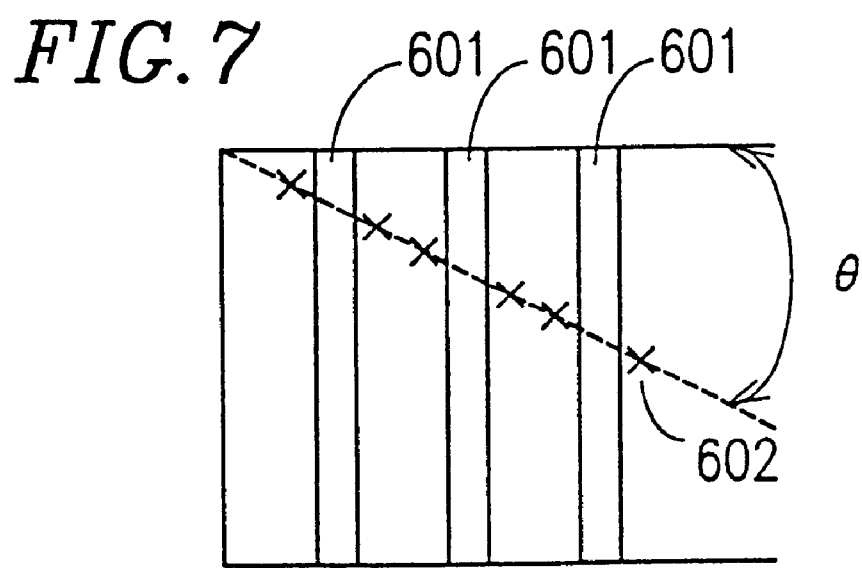
FIG. 7 schematically explains a deviation θ of an alignment key with respect to an active layer stripe.

Furthermore, in the case of flip chip-mounting the semiconductor laser device 300 having the alignment region 302 on a chip carrier 400, as shown in FIG. 5A, the edges 322, 323, or 326, or alignment keys 401 formed using these edges, and alignment keys 402 formed on a surface of the chip carrier are used to mount the semiconductor laser device 300 with chip carrier 400, whereby the semiconductor laser device 300 can be mounted on the chip carrier 400 with minimum misalignment. This is because the edges 322, 323, and 326 are accurately formed so as to have a predetermined positional relationship with a light emission point. Further, there occurs no problem related to the deviation θ (as described with reference to FIG. 7). Furthermore, as shown in FIG. 5B, even when an optical fiber 410 has already been combined with the chip carrier 400, the semiconductor laser device 300 is mounted on the chip carrier while aligning the semiconductor laser device 300 with the optical fiber 410 using alignment keys (passive alignment) without monitoring optical power from the optical fiber 410 (active alignment), so that the light from the semiconductor laser device 300 can be coupled to the optical fiber 410 with a high efficiency. In this case, a position of the optical fiber 410 is determined depending on an opening size of a V-shaped groove of the chip carrier 400.

Figure 6:
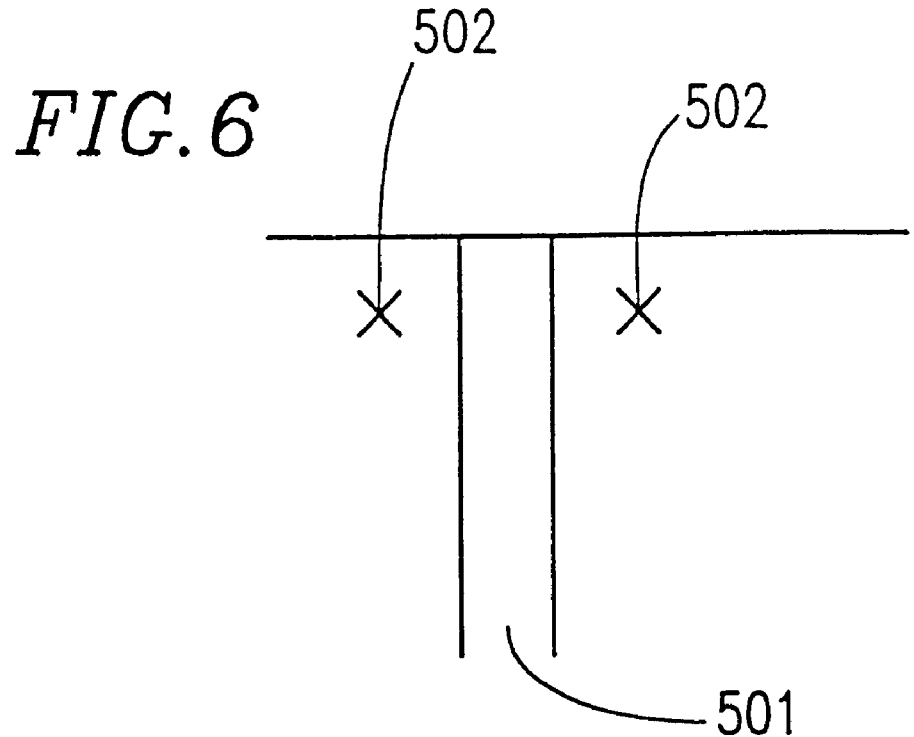
FIG. 6 illustrates other positioning example of an alignment structure according to Example 2 of the present invention.

In Example 2, the edges 322, 323, and 326 are used as reference lines for alignment. However, similar effects can be attained by using edges 328 on the periphery of the selective growth mask 318 for alignment instead of the edges 322, 323, and 326. Furthermore, as shown in FIG. 6, alignment can be controlled by providing alignment structures 502 in symmetry on both sides of the active layer stripe 501. Even if the alignment structures 502 are not provided in symmetry, alignment can be controlled as long as the active layer stripe is accurately formed so as to have a predetermined positional relationship with a light emission point.

In Examples 1 and 2, as shown in FIGS. 1 and 3A, the height of a second buried layer (n-InP layers 108 or 311) from a surface of the substrate 100 or 300 (height $L_1$ of FIG. 1, or height $L_3$ of FIG. 3A) is higher than that of the selective growth mask 115 or 318 from the substrate 100 or 300 (height $L_2$ of FIG. 1, or height $L_4$ of FIG. 3A) ($L_1>L_2$, $L_3>L_4$). A relationship as to the height between the selective growth mask and the second buried layer varies according to growth conditions of the second buried layer and the height of the second buried layer. The height of the second buried layer from the substrate surface cannot always be higher than that of the selective growth mask from the substrate surface. For example, in Example 1, the height of the selective growth mask 115 from the surface of the substrate 100 may be higher than that of the n-InP layer 108 from the substrate surface ($L_1<L_2$). In Example 2, the height of the selective growth mask 318 from the substrate 303 may be higher than that of the n-InP layer 311 from the substrate surface ($L_3<L_4$).

In Examples 1 and 2, an (111)A face is formed by both of the second buried layer (n-InP layer 108 or 311) and a third buried layer (p-InP layer 109 or 312) since the height of the second buried layer from the substrate surface is higher than that of the selective growth mask from the substrate surface ($L_1>L_2$, $L_3>L_4$). In the case where the height of the selective growth mask from the substrate surface is higher than that of the second buried layer ($L_1<L_2$, $L_3<L_4$), the (111)A or (111)B face is formed only by the third buried layer, but not by the second buried layer. For example, in Example 1, in the case where the height of the selective growth mask 115 from the substrate surface is higher than that of the n-InP layer 108 from the substrate surface, the (111)A face is formed only by the p-InP buried layer 109. Furthermore, in Example 2, in the case where the height of the selective growth mask 115 from the substrate surface is higher than that of the n-InP layer 108 from the substrate surface, the (111)A face is formed only by the p-InP buried layer 312.

Examples 1 and 2 take advantage of a dielectric film (selective growth mask), such as $SiO_2$ or $SiN_x$, on which the crystal growth of an InP buried layer does not occur. The selective growth mask may be any amorphous dielectric film, e.g., a dielectric film such as an amorphous Si or $TiO_2$. However, the amorphous Si is difficult to remove. Accordingly, in the case where the selective growth mask is required to be removed in a subsequent step, it is preferable to use $SiO_2$ or $SiN_x$ for the mask. Furthermore, the buried layer may be an InGaAsP buried layer, GaAs buried layer, InGaAs buried layer, AlGaInP buried layer, GaInP buried layer, InNPAs buried layer, InGaNAs buried layer, etc., besides the InP buried layer.

As described in detail above, according to present invention, a (111) or (001) face is formed within an alignment stripe or alignment region which is formed using the same mask as that used for forming a light emission region of a buried heterostructure type (buried type) semiconductor laser device, and a sharp edge is formed by the (111) or (001) face and a (100) face, which can be observed as a clear line in infrared rays or a commonly-employed microscope. The sharp edge as a clear line or an edge of a selective growth mask is accurately formed so as to have a predetermined positional relationship with the light emission region (i.e., a deviation from a predetermined positional relationship between the selective growth mask and a light emission point is zero). Accordingly, in the case where alignment keys for use in production steps are formed using such a edge as a clear line as reference lines, a group of alignment keys can be formed with high accuracy so as to have a predetermined positional relationship with the light emission point. Furthermore, in the case of flip chip-mounting a semiconductor laser device of the present invention on a chip carrier, with the above-described edges and alignment keys preformed on the chip carrier, the semiconductor laser device can be mounted on the chip carrier with high accuracy. Even in the case where an optical fiber has already been mounted on the chip carrier, high light-coupling efficiency can be attained only by combining the semiconductor laser device with the chip carrier using the alignment keys of the semiconductor laser device and the chip carrier (passive alignment). As a result, a reduction in production cost of a module of a semiconductor laser device can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device, comprising a substrate, a light emission region provided on the substrate, and an alignment stripe provided on the substrate so as to be adjacent to the light emission region, wherein:

the light emission region includes
a first active layer stripe having a layered structure including a first waveguide layer, an active layer, and a second waveguide layer, the active layer being interposed between the first waveguide layer and the second waveguide layer,
a first buried layer having a first polarity and formed so as to cover side faces of the active layer stripe,
a second buried layer having a second polarity opposite the first polarity and formed on the first buried layer, and
a third buried layer having the first polarity and formed on the second buried layer and the active layer stripe; and
the alignment stripe includes
a second active layer stripe having a layered structure including the first waveguide layer, the active layer, and the second waveguide layer, and
a selective growth mask formed on the second active layer stripe and formed of a material on which the first buried layer, the second buried layer and the third buried layer are incapable of growing.

2. A semiconductor laser device according to claim 1, wherein at least one of faces of the third buried layer has a (111) face, a neighborhood face of the (111) face, a (001) face, and a neighborhood face of the (001) face which is present in the vicinity of both sides of selective growth mask in the alignment stripe.

3. A semiconductor laser device, comprising a substrate, a light emission region provided on the substrate, and an alignment region provided on the substrate so as to be adjacent to the light emission region, wherein:

the light emission region includes
an active layer stripe having a layered structure including a first waveguide layer, an active layer, and a second waveguide layer, the active layer being interposed between the first waveguide layer and the second waveguide layer,
a first buried layer having a first polarity and formed so as to cover side faces of the active layer stripe,
a second buried layer having a second polarity opposite the first polarity and formed on the first buried layer, and
a third buried layer having the first polarity and formed on the second buried layer and the active layer stripe; and
the alignment region includes
an active layer region having a layered structure including the first waveguide layer, the active layer, and the second waveguide layer, and
a selective growth mask formed on the active layer region and formed of a material on which the first buried layer, the second buried layer and the third buried layer are incapable of growing.

4. A semiconductor laser device according to claim 3, wherein at least one of faces of the third buried layer has a (111) face, a neighborhood face of the (111) face, a (001) face, and a neighborhood face of the (001) face which is present in the vicinity of the edges of selective growth mask in the alignment region.

5. A semiconductor laser device according to claim 3, wherein the active layer stripe is formed so as to extend in a [011] direction, and the selective growth mask has at least one of the sides which includes a side which extends in a direction substantially parallel to the active layer stripe, a side which extends in a direction substantially perpendicular to the active layer stripe, and a side which extends in a direction crossing the active layer stripe at an angle of approximately 45 degrees.

* * * * *